US006980004B2

(12) United States Patent
Barbic

(10) Patent No.: US 6,980,004 B2
(45) Date of Patent: Dec. 27, 2005

(54) APPARATUS AND METHOD FOR DETECTION OF MAGNETIC RESONANCE BY A MAGNETO-RESISTIVE SENSOR

(75) Inventor: Mladen Barbic, San Gabriel, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/976,559

(22) Filed: Oct. 29, 2004

(65) Prior Publication Data

US 2005/0116713 A1 Jun. 2, 2005

Related U.S. Application Data

(60) Provisional application No. 60/515,742, filed on Oct. 30, 2003.

(51) Int. Cl.[7] .............................................. G01V 3/00
(52) U.S. Cl. ..................................... 324/318; 324/309
(58) Field of Search ............................... 324/318, 322, 324/319, 3–9, 307, 765; 600/424, 410

(56) References Cited

U.S. PATENT DOCUMENTS 6,101,417 A * 8/2000 Vogel et al. .................. 607/30
6,129,668 A * 10/2000 Haynor et al. .............. 600/424
6,452,413 B1 * 9/2002 Burghartz ................... 324/765

OTHER PUBLICATIONS

Barbic et al., "Recording Processes in Perpendicular Patterned Media Using Logitudinal Magnetic Recording Heads," IEEE Transactions on magnetics, vol. 37, No. 4, Jul. 2001, pp. 1657-1660.
O'Barr et al., "A Scanning Microscope Using a Magnetoresistive Head as the Sensing Element," J. Appl. Phys. 79(8), Apr. 1996, pp. 6067-6069.
Todorovic et al., "Writing and reading of Single Magnetic Domain Per Bit Perpendicular Patterned Media," Appl. Phys. Lett., vol. 74, No. 17, Apr. 1999, pp. 2516-2518.
Yamamoto et al., "MR Head Response from Arrays of Lithographically Paterned Perpendicular Nickel Columns," IEEE Transactions on Magnetics, vol. 33, No. 5, Sep. 1997, pp. 3016-3018.
Yamamoto et al., "Scanning Magnetoresistance Microscopy," Appl. Phys. Lett., vol. 69, No. 21, Nov. 1996, pp. 3263-3265.

* cited by examiner

*Primary Examiner*—Brij B. Shrivastav
(74) *Attorney, Agent, or Firm*—Townsend and Townsend and Crew LLP

(57) ABSTRACT

A magnetic-resonance imaging system including a magnetic-resonance sensor including at least one magneto-resistive element; and a sample disposed adjacent to the magnetic-resonance sensor and configurable to generate a magnetic-resonance signal, wherein the magneto-resistive element is configured to generate a magnetic field in response to a current driven through the magneto-resistive element, the magnetic field being configured to polarize spins of the sample, and detect a magnetic-resonance signal from precession of the spins.

42 Claims, 10 Drawing Sheets

APPARATUS AND METHOD FOR DETECTION OF MAGNETIC RESONANCE BY A MAGNETO-RESISTIVE SENSOR

CROSS-REFERENCES TO RELATED APPLICATIONS

This is a nonprovisional patent application that claims priority to U.S. Provisional Patent Application No. 60/515,742, filed Oct. 30, 2003, titled "METHOD FOR DETECTION OF MAGNETIC RESONANCE IMAGING BY A MAGNETO-RESISTIVE SENSOR," which is incorporated by reference herein in its entirety for all purposes.

This invention was made with government support under Grant No. R01 H6002644, awarded by the National Institute of Health. The government may have certain rights in this invention.

BACKGROUND OF THE INVENTION

The present invention relates to apparatus and techniques for magnetic resonance imaging (MRI). More specifically, the present invention relates to magneto-resistive sensor apparatus and magneto-resistive sensor techniques for MRI.

Magnetic resonance imaging (MRI) has become a well-established two-dimensional (2D) and three-dimensional (3D) visualization technology with extensive applicability in clinical medicine and basic research. MRI techniques provide detailed images of structures inside bodies and samples that exceed the level of image detail currently provided by x-ray techniques. Further, MRI techniques do not introduce the deleterious effect on a body or a sample that the ionizing radiation of x-ray techniques introduce.

Improvements in imaging resolution of MRI have steadily progressed in the last three decades from the relatively crude images generated by early MRI machines to the current spatial resolution of relatively modern MRI machines. The current spacial resolution provided by modern MRI machines is approximately 1 micrometer of resolution. The resolution of MRI stands in contrast with other imaging technologies, such as electron microscopy and various scanning probe microscopies that provide resolution down to the atomic level.

MRI techniques generally include applying an initial polarizing magnetic field to a sample (e.g., body, scientific sample, etc.) to generate an image of the sample. A radio frequency (RF) magnetic field is also applied to the sample, which is relatively small compared to the polarizing magnetic field. The RF magnetic field is applied to the sample generally perpendicular to the polarizing magnetic field. At a resonant frequency of the RF magnetic field, magnetic resonance of nuclear spins and/or electron spins can be observed as the spins precess. Magnetic resonance signals have traditionally been detected by inductive coils, mechanical detectors, and Hall sensors. While these detectors have been used extensively for magnetic resonance detection, the resolution of these sensors is limited. For example, coil detectors often lack sufficient sensitivity to detect relatively weak magnetic resonance signals and therefore lack the resolving power to resolve these weak signals.

Other resolution limiting factors of traditional MRI techniques include the magnetic field gradients that are applied to samples to image spatial spin distributions. Traditional magnetic field gradients often lack relatively high magnetic imaging gradients sufficient for relatively high MRI resolution.

Therefore, new MRI apparatus and techniques are needed that provide relatively high MRI resolution, are simple and inexpensive to manufacture, and are relatively simple to use.

BRIEF SUMMARY OF THE INVENTION

The present invention relates to apparatus and techniques for magnetic resonance imaging (MRI). More specifically, the present invention relates to magneto-resistive sensor apparatus and magneto-resistive sensor techniques for MRI.

According to one embodiment, a magnetic-resonance imaging (MRI) system includes a magnetic-resonance sensor including at least one magneto-resistive element; and a sample disposed adjacent to the magnetic-resonance sensor and configurable to generate a magnetic-resonance signal, wherein the magneto-resistive element is configured to generate a magnetic field in response to a current driven through the magneto-resistive element, the magnetic field being configured to polarize spins of the sample, and detect a magnetic-resonance signal from precession of the spins. According to a specific embodiment, the magnetic-resonance sensor further includes at least first and second magnetic shields disposed on opposite sides of the magneto-resistive element, and the first and second magnetic shields are configured to magnify the magnetic field in the sample. The magneto-resistive element is configured to detect a magnetic-resonance signal from precession of the spins for magnetic-resonance image formation. According to another specific embodiment, the system further includes an electronic module configured to detect resistance changes of a resistance of the magneto-resonance element, wherein the resistance is configured in response to the detected magnetic-resonance signal. According to yet another specific embodiment, the system further includes a radio frequency (RF) magnetic-field generator configured to generate a RF magnetic field having a frequency that substantially matches the resonant frequency of the spins and is configured to couple to the spins causing the spins to precess. The RF magnetic filed generator may include one or more coils configured to generate an RF magnetic field. Alternatively, the RF magnetic field may be a conductive strip disposed adjacent to a surface of the sample and configured to generate the RF magnetic field in response to an alternating electric current driven though the conductive strip.

According to another embodiment, a magnetic-resonance imaging system includes a magnetic element configured to generate a first magnetic field and sense second magnetic field, wherein the magnetic element is configured to change resistance based on sensing the second magnetic field; a radio frequency (RF) magnetic-field generator configured to generate an RF magnetic field; and a sample configured to receive the first magnetic field and the RF magnetic field, wherein the first magnetic field is configured to polarize spins in the sample and the RF field is configured to cause the spins to precess, and wherein the second magnetic field includes a magnetic-resonance signal of the precessing spins.

According to another embodiment, a magnetic-resonance method includes driving a current though a magneto-resistive element to generate a magnetic field; applying the magnetic field to a sample; polarizing a plurality of spins of the sample in response to the applying step; applying a radio-frequency (RF) magnetic field to the sample to precess the spins about an axis, wherein a frequency of the RF magnetic field substantially matches a resonant frequency of the spins; receiving in the magneto-resistive element a varying magnetic field generated by the precessing spins;

detecting a resistance change of the magneto-resistive element in response to the receiving step; and generating a magnetic-resonance image based on the changing resistance of the magneto-resistive element. The step of detecting the resistance change may include measuring a changing voltage across the magneto-resistive element. The voltage is associated with the current driven through the magneto-resistive element. According to a specific embodiment, the method further includes scanning the magneto-resistive element across at least a portion of a surface of the sample, wherein the magnetic-resonance image includes image information associated with the portion of the surface.

Numerous benefits are achieved for magnetic-resonance sensing and magnetic-resonance imaging by way of the present invention over conventional techniques. For example, a distinct difference between an embodiment of a magneto-resistive sensor of the present invention and a traditional-inductive detector (e.g., a coil) is that the magneto-resistive sensor is a magnetic flux sensing device, whereas the inductive detector is a flux-time-derivative sensing device. Therefore, the response of a magneto-resistive sensor tends not to vary with frequency. Moreover, the dimensions of magneto-resistive sensors may be made relatively small compared to traditional-inductive detectors. The relatively small size of magneto-resistive sensors provides for increased imaging resolution as compared to the traditional-inductive detectors. Further, magneto-resistive sensors according to embodiments of the present invention are configured to generate a relatively large signal amplitudes compared with traditional-inductive detectors, thereby providing for relatively high signal-to-noise ratios and relatively shorter imaging times as compared to traditional-inductive detectors. Further yet, the resolving power of the magnetic-resonance system ranges from approximately 1 millimeter to less than 100 nanometers, as compared to traditional MRI system that typically provide image resolution as low as about 1 micrometer. These and other benefits will be described in more detail throughout the present specification and more particularly below.

Various additional objects, features, and advantages of the present invention can be more fully appreciated with reference to the detailed description and accompanying drawings that follow.

DESCRIPTION OF SPECIFIC EMBODIMENTS

The present invention provides an apparatus and technique for magnetic resonance imaging (MRI). More specifically, the present invention provides a magneto-resistive sensor apparatus and magneto-resistive sensor technique for MRI.

Figure 1:
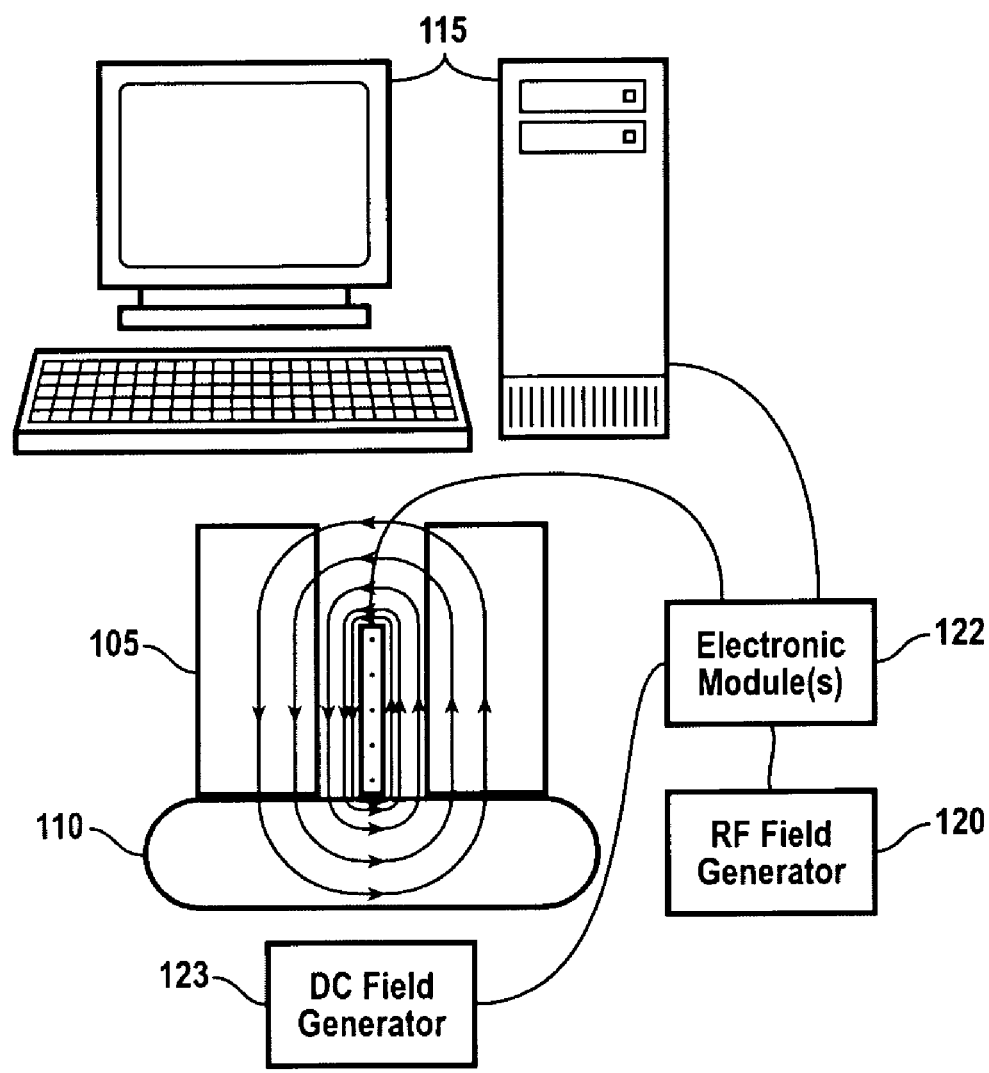
FIG. 1 is a simplified schematic of a magnetic resonance system according to one embodiment of the present invention.

FIG. 1 is a simplified schematic of an MRI system 100 according to one embodiment of the present invention. MRI system 100 and its components are not drawn to scale in FIG. 1, but are drawn for convenience to simplify the description of the MRI system. MRI system 100 includes a magnetic-resonance sensor 105, a sample 110 that is configurable to generate a magnetic-resonance signal, a computer system 115, a radio frequency (RF) magnetic-field generator 120, and one or more electronic modules 122 that are configured to control and monitor magnetic-resonance sensor 105. According to some embodiments, MRI system 100 might also include a magnetic field generator 123. For example, electronic module 122 might be configured to apply voltage (i.e., supply current) to the magnetic-resonance sensor, and might be configured to monitor the magnetic-resonance sensor to determine an amount of magnetic field applied to the magnetic-resonance sensor from the sample for the generation of a magnetic resonance image of the sample (described in detail below). Computer system 115 might be configured to control and monitor electronic modules 122 to generate the magnetic-resonance image. Computer system 115 might also be configured to control the RF magnetic-field generator, for example to control the frequency and intensity of the RF magnetic field generated by the generator. Sample 110 may be nearly any type of sample configurable to generate a magnetic-resonance signal. For example, sample 110 might be living matter (such as the living tissue of a human body or the like), once-living matter, a scientific sample used for research purposes, a product configured for production, a fluid sample (such as a liquid sample) or the like.

Figure 2A:
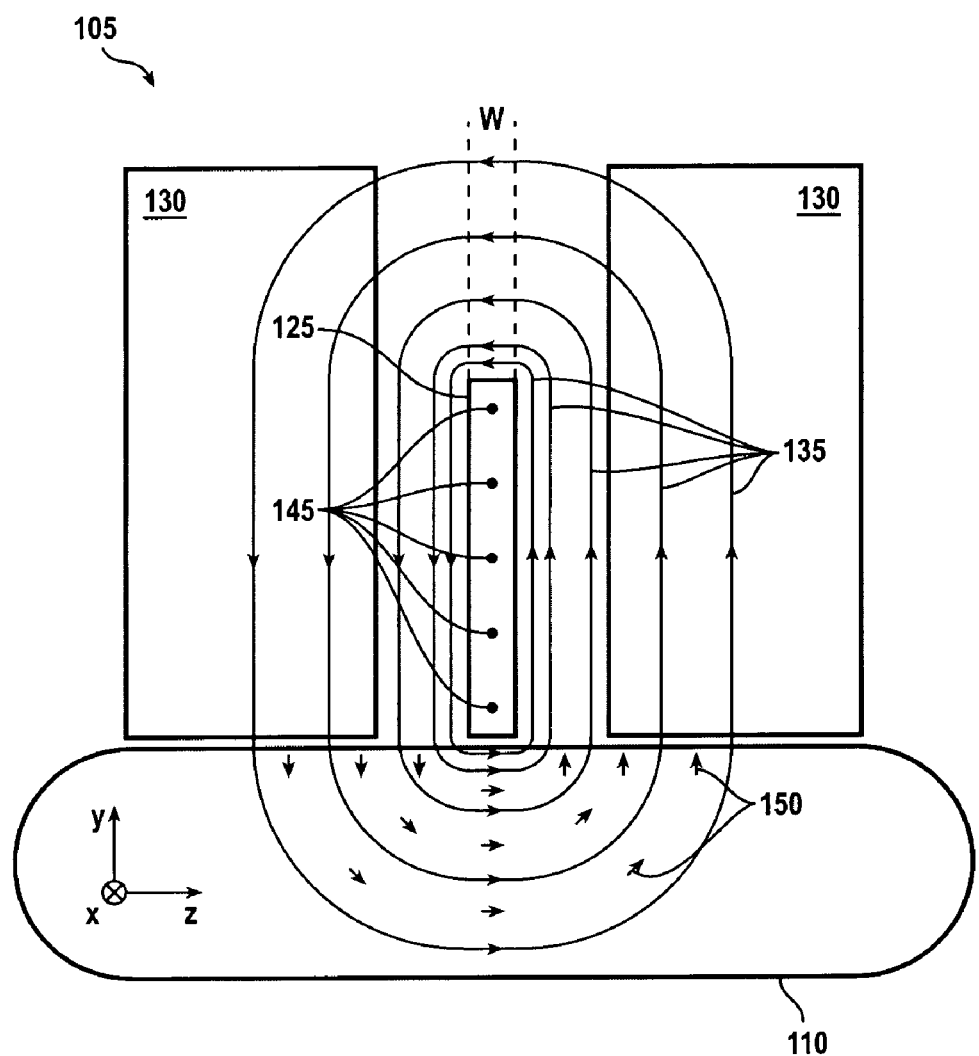
FIG. 2A is a magnified cross-sectional view of a magnetic-resonance sensor and sample according to one embodiment of the present invention.

FIG. 2A is a magnified cross-sectional view of magnetic-resonance sensor 105 and sample 110. For convenience and to simplify the current description, FIG. 2A is described with respect to a reference system (e.g., a Cartesian coordinate system). The reference system is arbitrarily chosen such that the z-axis of the reference system is directed right along the plane of the page, the y-axis is directed upward along the plane of the page, and the x-axis directed perpendicularly into the plane of the page. Following a standard notation convention, the direction of the x-axis is indicated in FIG. 2A with a cross positioned in a circle, which indicates the x-axis is into the plane of the page. A dot within a circle is an indication of an axis extending out from the plane of the page. As described herein, each of these axes includes all axes parallel to these axes. That is, the origin of the reference system may be arbitrarily positioned without changing the nature of the described embodiments of the invention.

According to one embodiment, magnetic-resonance sensor 105 includes a magneto-resistive element 125 and may include one or more magnetic shields 130. Magneto-resistive element 125 is a conductive element such that the resistance of the magneto-resistive element is configured to change in the presence of an externally applied magnetic field, such as an externally applied magnetic field from sample 110. Resistance changes of the magneto-resistive element might be detected by electronic module 122. For example, electronic module 122 might include an ohmmeter that is configured to detect resistance changes (e.g., apply Ohm's law) of the magneto-resistive sensor. The ohmmeter might be a force voltage measure current device or a force current measure voltage device. The resistance changes of the magneto-resistive sensor may be calibrated such that the resistance changes indicate a known amount of magnetic field applied to the magneto-resistive sensor by the sample (described below in detail).

Figure 2B:
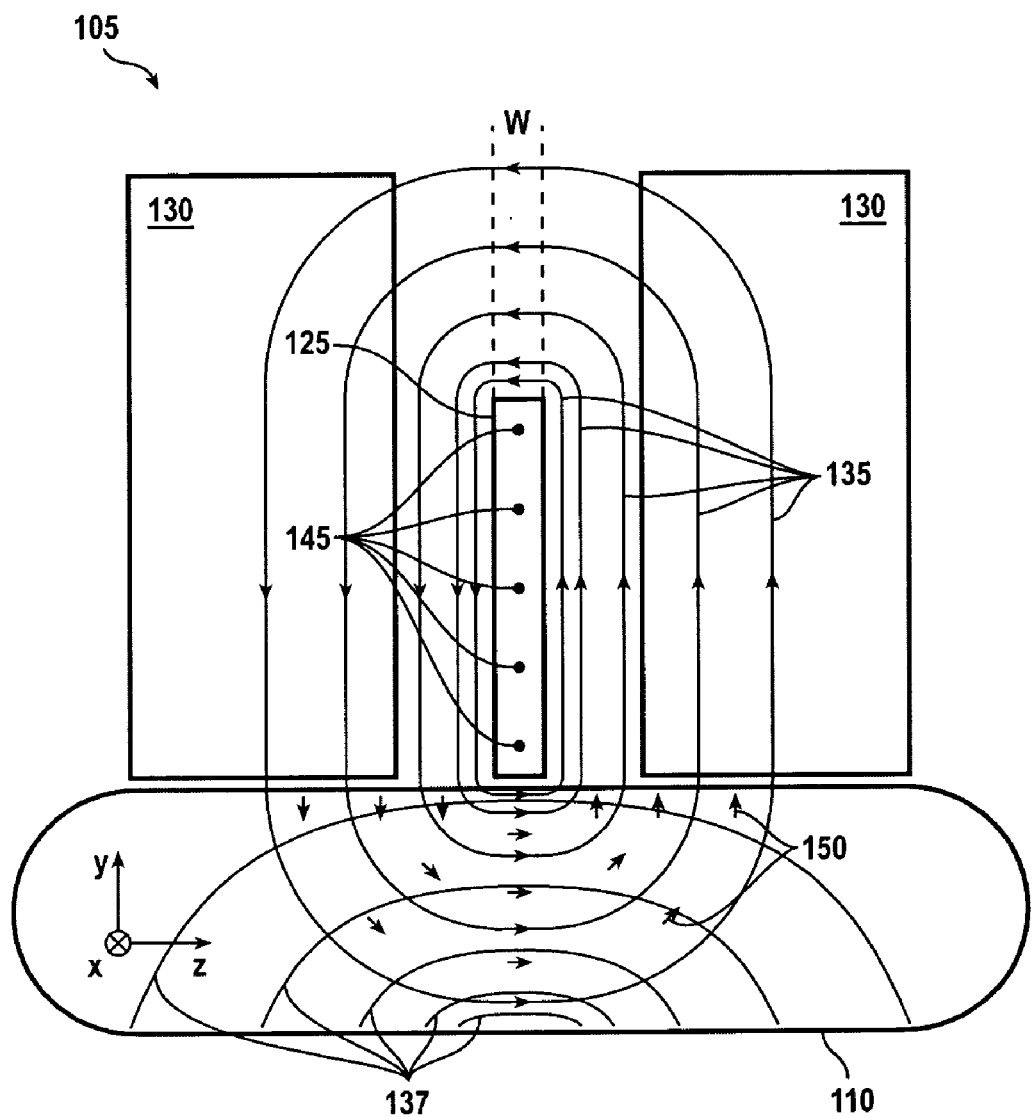
FIG. 2B is a magnified cross-sectional view of a magnetic-resonance sensor and sample according to another embodiment of the present invention.

Magneto-restive sensor 105 is also configured to generate a magnetic field 135. For example, as current is driven through the magneto-resistive sensor, the sensor may generate magnetic field 135. Current may be driven through the magneto-resistive sensor by electronic module 120 substantially along the x-axis (i.e., perpendicular to the plane of the page) to generate magnetic field 135. The applied current is indicated by dots 145. According to one embodiment, the current driven through the sensor is approximately 5 milliamps to approximately 20 milliamps, inclusive. The magnetic field strength generated by this current may be approximately 100 gauss to approximately 1000 gauss, inclusive. However, other currents may be driven through the magneto-resistive element to generate other magnetic field strengths. The magneto-resistive sensor may be positioned relatively near the sample (e.g., within about 2 millimeters, within about 1 micrometer, within about 100 nanometers etc.) and might contact the sample such that the magnetic field generated by the magneto-resistive sensor is present in the sample as shown in FIG. 2A. The distance from the sample the magneto-resistive element is placed may be based on the size of the magneto-resistive sensor or other factors. For example, a relatively larger magneto-resistive sensor having a relatively large magneto-resistive element may be configured such that this sensor can be placed relatively farther from a sample to collect a magnetic resonance signal. Dimensions of various magneto-resistive element embodiments are described below in further detail. Magnetic field 135 is configured to polarize the nuclear spins and/or electronic spins (e.g., unpaired spins) in sample 110. The polarization of the spins is generally indicated by short arrows 150 in FIG. 2A. According to one embodiment, magnetic field generator 123 might also be configured to generate a magnetic field 137 (a portion of which is shown in FIG. 2B) that is substantially parallel to magnetic filed 135 in portions of the sample for which a magnetic-resonance signal is to be detected, such as below the magneto-resistive element. Magnetic field 137 might be configured to polarize the nuclear spins and/or electronic spins of the sample. According to some embodiments, the field strength of magnetic field 137 might be approximately 100 gauss to approximately 200 gauss, inclusive, or might be approximately 100 gauss to approximately 1000 gauss, inclusive. Magnetic field generator 123 might include one or more coils, one or more superconducting coils, a permanent magnet or the like. It should be understood that the positions of the modules and generators with respect to the sample as shown in FIG. 1 are shown for convenience and that the modules and generators might be placed at other locations with respect to the sample.

According to one embodiment, magnetic shields 130 are configured to locally (e.g., below the magneto-resistive element, in the portion of the sample that is below the magneto-resistive element, etc.) magnify the magnetic field lines. Field magnification in the region of the sample substantially below the magneto-resistive element generally provides for improved MR imaging and MR spectroscopy of the regions. The magnetic shields might have a relatively high permeability (e.g., a permeability greater than approximately 100) to magnify the magnetic field in the sample. For example, the magnetic shields might be relatively high permeability ferromagnetic shields, such as nickel-iron (e.g., permalloy) shields. According to an alternate embodiment, the magnetic shields have a relatively low permeability (e.g., a permeability less than or equal to approximately 100) and may be configured to magnify the magnetic field in the sample by a lesser amount than a magnetic shield embodiment having a relatively higher permeability. According to some embodiments, magnetic-resonance sensor 105 does not include magnetic shields.

Figure 3:
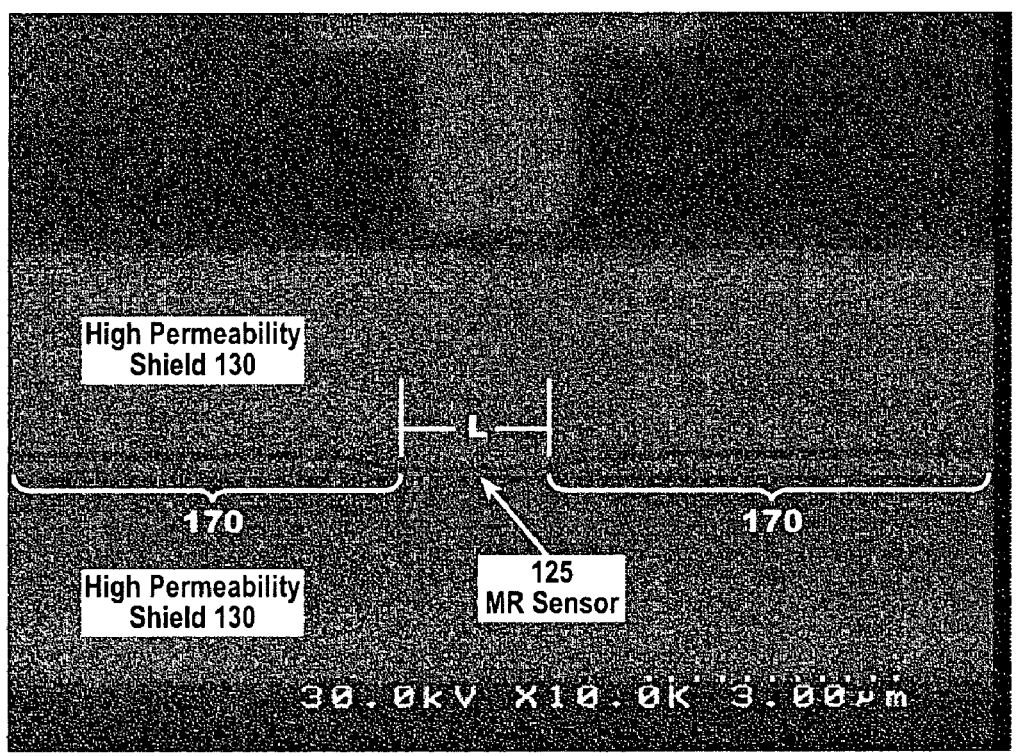
FIG. 3 is a bottom view of one embodiment of the magnetic-resonance sensor.
Figure 4:
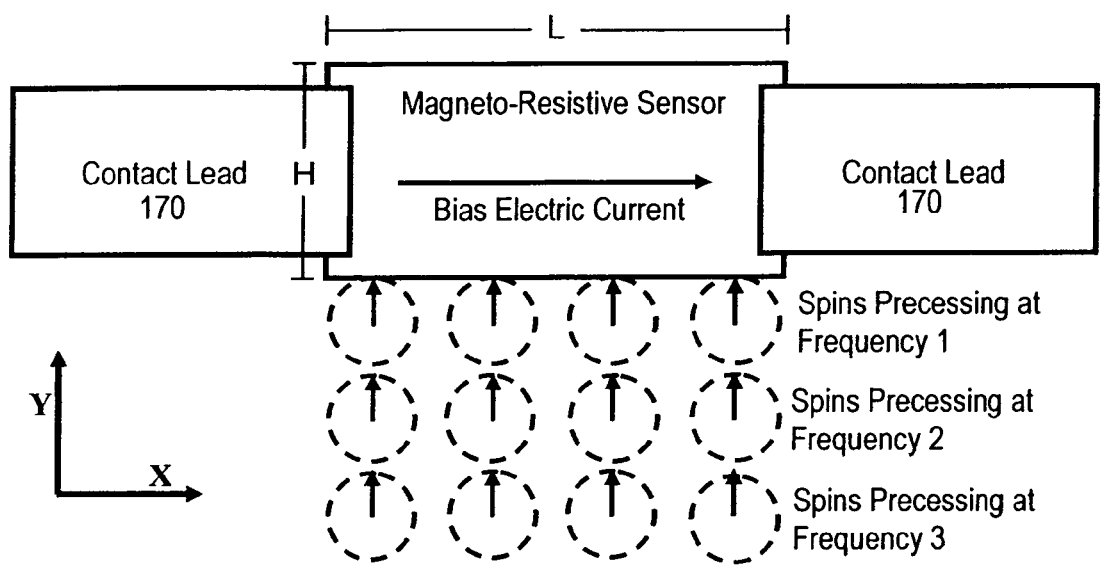
FIG. 4 is a cross-sectional view of the magneto-resistive sensor.

Magnetic-resonance sensor 105 might be of the same or similar configuration of magnetic-resonance sensors configured for use in the magnetic-data storage industry, such as the hard drive industry. According to a specific embodiment, magnetic-resonance sensor 105 is a read head configured to read magnetic media (e.g., magnetic disk) that might compose a portion of a hard drive. The magnetic-resonance sensor might be a read head that might be manufactured by International Business Machines (IBM) Corporation, Seagate Technology LLC or others. FIG. 3 is a bottom view of one embodiment of magnetic-resonance sensor 105 that might be manufactured by IBM Corporation or the like. This bottom view of the magnetic-resonance sensor shows shields 130 disposed on either side of magneto-resistive element 125. According to a specific embodiment of the present invention, the length L of the magneto-resistive element is approximately 250 nanometers to approximately 2 micrometer. The width W of the magneto-resistive element is approximately 25 nanometers to approximately 100 nanometers, inclusive (see FIG. 3). And the height H of the magneto-resistive element is approximately 250 nanometers to approximately 2 micrometers, inclusive (see FIGS. 2 and 4). FIG. 4 is a cross-sectional view of the magneto-resistive sensor along the x-axis, and shows a set of contact leads 170 (also indicated by numeral 170 in FIG. 3) that are configured to contact the magneto-resistive element to drive current through the element. It should be understood that the foregoing described length, width, and height of the magneto-resistive element are illustrative of a specific embodiment and that other magnitudes of these dimensions are contemplated. For example, the width of the magneto-resistive sensor might be larger than the width described above for generating magnetic-resonance images of select sample types, such as fluids for which molecular motion might degrade a magnetic-resonance image generated by a magneto-resistive sensor having a relatively small width (e.g., 25 nanometers or less). Further, the width of the magneto-resistive element might be smaller than the width described above for generating magnetic-resonance images of other sample types. Therefore, it should be understood that the foregoing described dimensions are not limiting on the invention as recited in the claims.

According to one embodiment, (RF) magnetic-field generator 120 is configured to apply a RF magnetic field to the sample such that the RF magnetic field has a select orientation (e.g., perpendicular) with respect to magnetic field 135 in the region of the sample for which a magnetic-resonance image is to be generated. The RF magnetic field may also have a select orientation (e.g., perpendicular) with respect to a sensing direction of the magneto-resistive sensor. For example, the sensing direction of the magnetoresistive sensor might be along the y-axis, and the RF magnetic field might be applied to the sample along the x-axis. The frequency of the RF magnetic field is substantially matched to the resonant frequency of the nuclear spins and/or the electronic spins of the sample, and causes these spins to precess in the X-Y plane. The RF magnetic field generated by the RF magnetic-field generator may generate a substantially continuous wave field or a pulsed field. The precessing nuclear spins and/or electronic spins generate a directionally-varying magnetic flux (such that the direction of the flux varies over time) in the sensor, and more specifically in the magneto-resistive element. This directionally-varying magnetic flux generated by the spins causes a time-varying resistance of the magneto-resistive element, and this time-varying resistance of the sensor causes a time-varying change in the voltage across the sensor. This time-varying voltage change can be detected by electronic module 122 as the electronic module drives current through the magneto-resistive element. This detected resistance change of the magneto-resistive element may be used to generate magnetic-resonance images of the sample. For example, computer system 115 may be configured to generate one or more magnetic-resonance image of the sample and generate a magnetic-resonance spectrum of the sample. Algorithms that might be run on computer system 115 and are configured to magnetic-resonance image generation are well known to those of skill in the art and will not be described herein.

According to one embodiment of the present invention, image resolution of magnetic-resonance images generated by magnetic-resonance system 100 may be varied according to the magnitudes of the dimensions of magnetic-resonance sensor 105. For example, resolution of magnetic-resonance images along the z-axis depends (at least in part) on the width of the magneto-resistive element along the z-axis of the element, on the distance between the shields, and on the permeability of the shields. Further, resolution of magnetic-resonance resonance images along the x-axis depends (at least in part) on the length of the magneto-resistive element along the x-axis. For example, resolution of magnetic-resonance images along the z-axis may generally be increased by decreasing the width of the magneto-resistive element, and may generally be increased along the x-axis by increasing the length of the magneto-resistive element. Therefore, the dimensions of the magnetic-resonance sensor element may be changed to adjust the resolving power of the magnetic-resonance system to a desired level.

Figure 5:
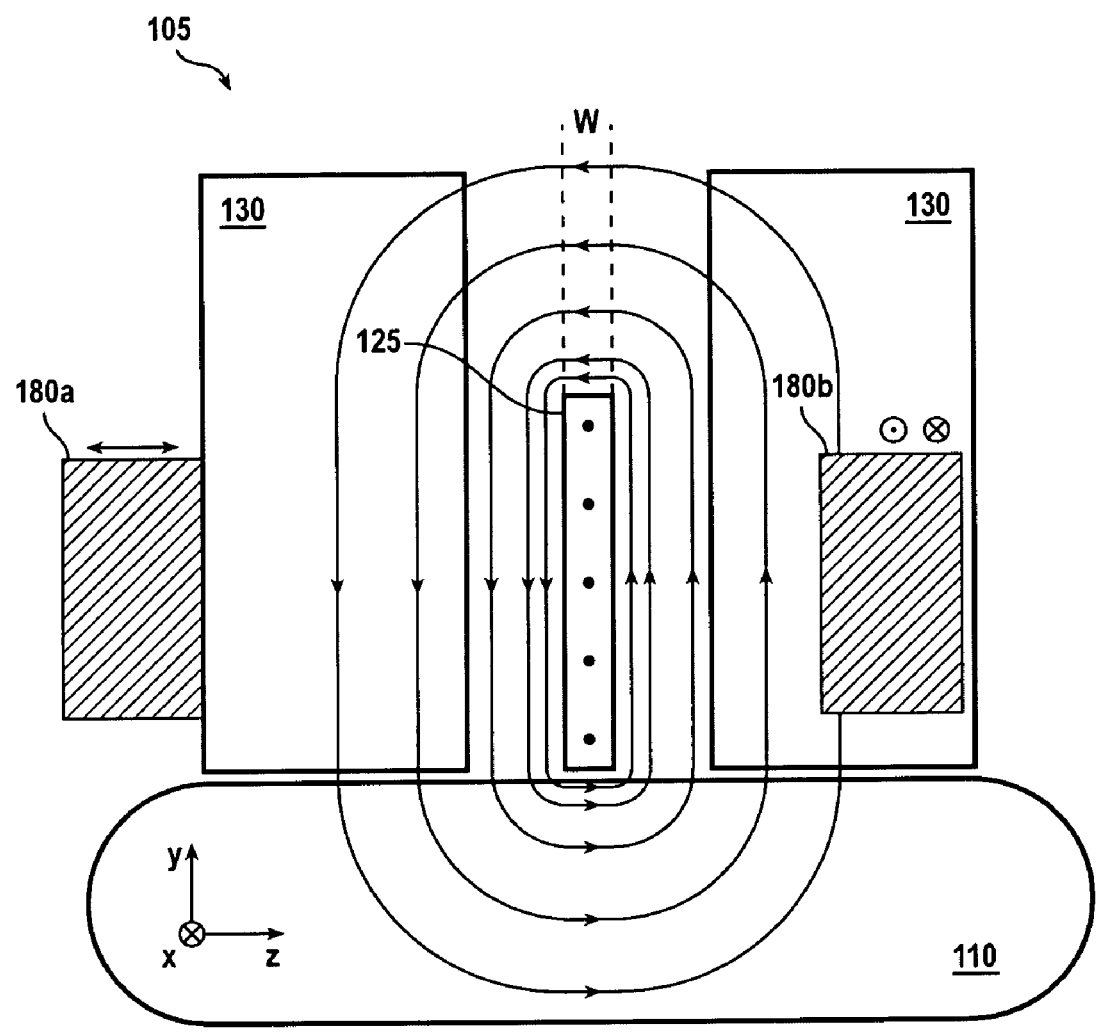
FIG. 5 is a simplified schematic of an embodiment of an MRI system that includes a translation system that is configured to scan the magnetic-resonance sensor across the surface of a sample.

According to one embodiment of the present invention, varying resolving power is also provided along the y-axis of the sample as the spins may precess at different frequencies at different heights y as shown in FIG. 4. This spin precession variation along the y-axis provides for the generation of magnetic-resonance images for various cross-sections of the sample along the y-axis as the differing magnetic resonance signals are detected by the sensor as originating from different heights along the y-axis of the sample. As the spins in the sample vary with height along the y-axis, the resolution of magnetic resonance images generated by magnetic-resonance system 100 depend on the distance between the shields and the value of the current through the magneto-resistive element. As embodiments of the present invention provide for the generation of magnetic-resonance images, for various cross-sections of the sample along the y-axis, a set of 3D magnetic resonance images may be generated. Moreover, by raster scanning the magnetic-resonance sensor over the sample, three-dimensional images of the sample may be generated without varying the intensity of magnetic field 135. The magnetic-resonance sensor may be scanned across a sample via the use of a translation system 180 (see FIG. 5), which might include translation elements 180a and 180b that are respectively configured to scan the magnetic-resonance sensor across the sample along the z-axis and the x-axis. The translation elements might include piezoelectric devices, solenoids or the like that might be controlled by computer system 120 or the like. While the translation elements are shown in FIG. 5 as being coupled to the magnetic-resonance sensor, it should be understood that the sample may be coupled to translations elements that are configured to translate the sample with respect to the magneto-resistive sensor.

Figure 6:
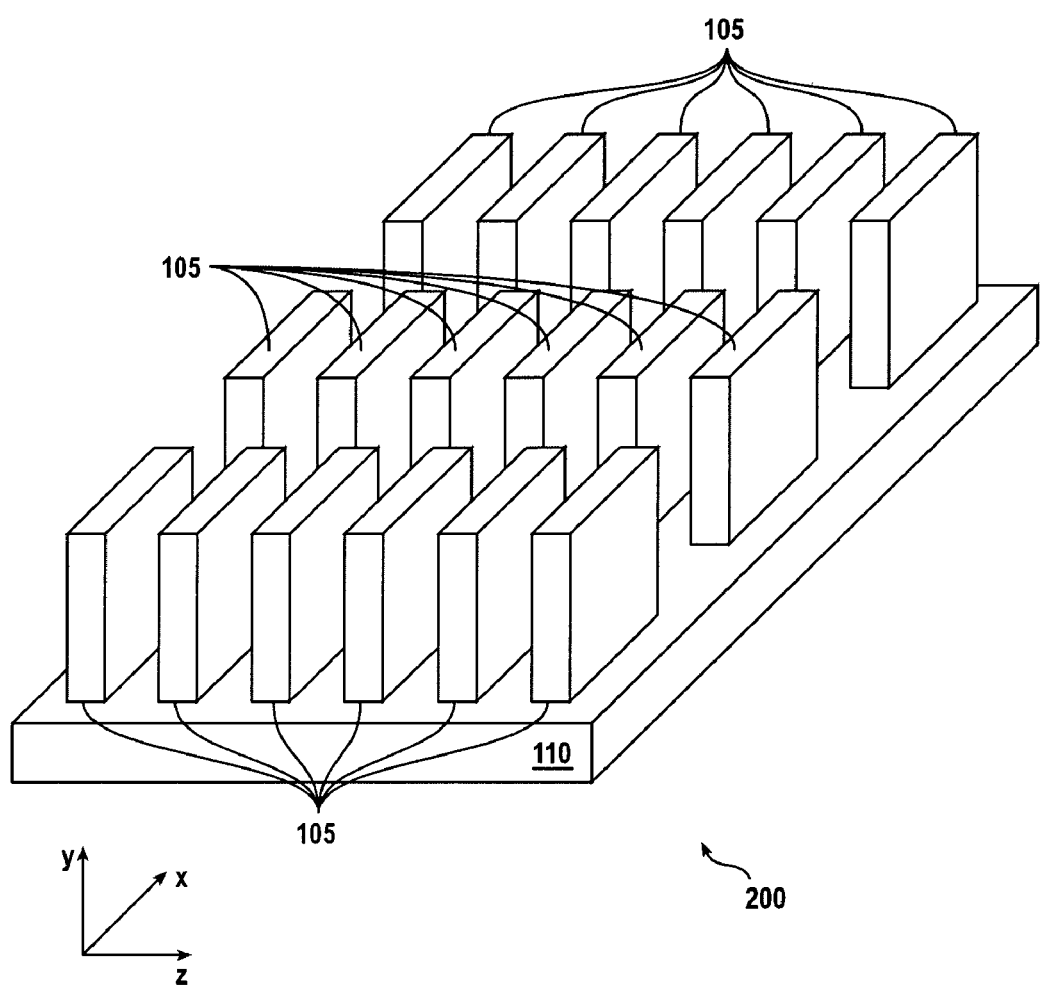
FIG. 6 is a simplified perspective view of an MRI system according to another embodiment of the present invention.

FIG. 6 is a simplified perspective view of an MRI system 200 according to another embodiment of the present invention. MRI system 200 includes a plurality of magnetic-resonance sensors 105 that is arranged in an array and is configured to detect a magnetic-resonance signal from the sample. Each of the sensors 105 of MRI system may be configured as described above. While, MRI system 200 is shown as including an array of magnetic-resonance sensors 105, the magnetic-resonance sensors may be arranged in a line of sensors that extend along the x-axis or the z-axis. The array of magnetic-resonance sensors might be configured to translate across the surface of the sample via a translation system 180 as described above. The array of magnetic-resonance sensors might be formed on a substrate, such as a semiconductor substrate, by known semiconductor manufacturing processes. According to some embodiments, the electronic system 120 may be formed on a substrate with the one or more (e.g., an array) of magnetic-resonance sensors. Further, one or more image processing steps that might otherwise be executed by computer system 105 might also be executed by one or more circuits (e.g., dedicated circuits) that might be formed on the substrate. Those of skill in the art understand such fabrication techniques and as such, these techniques will not be described in detail herein.

Figure 7:
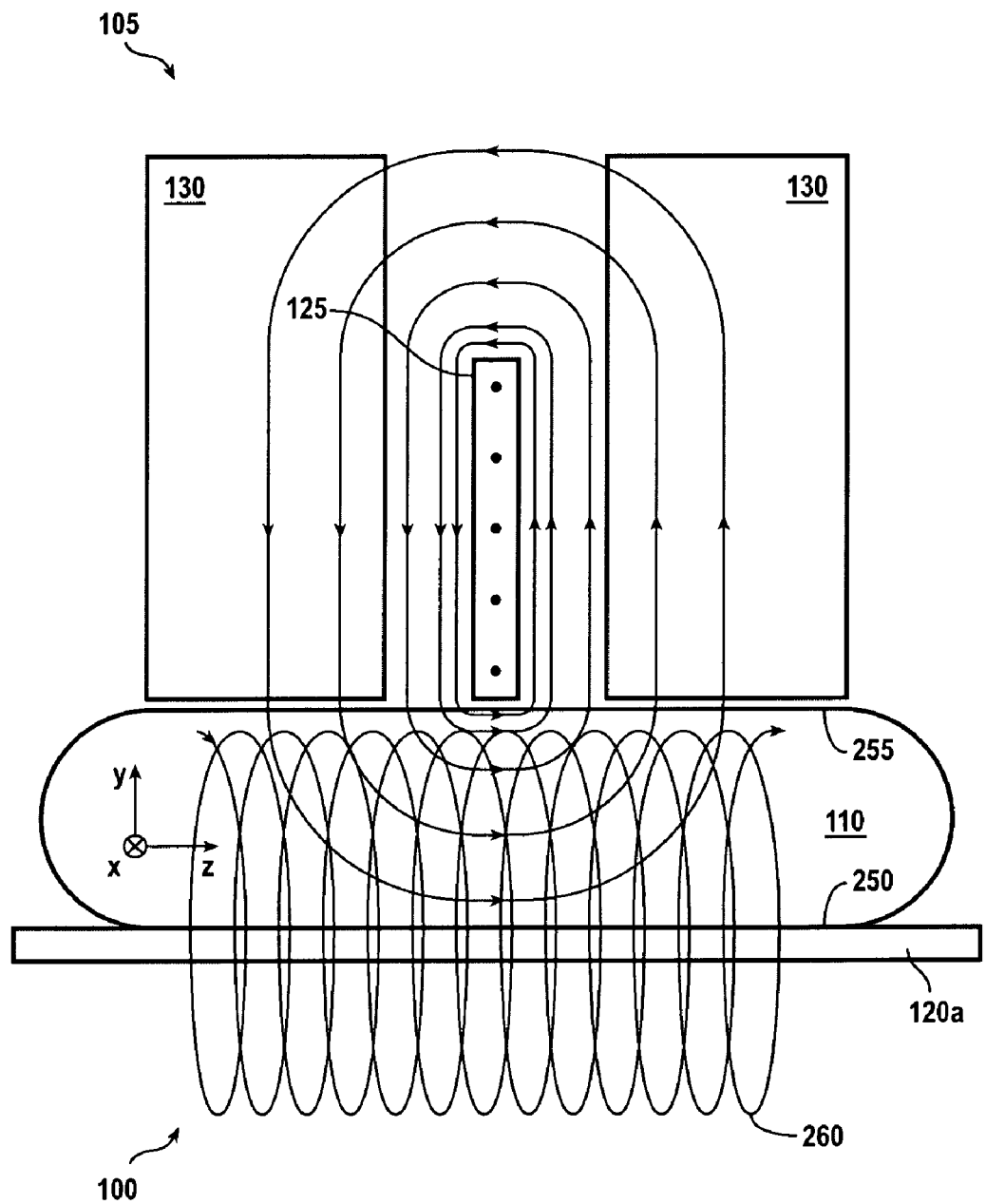
FIG. 7 is a simplified side view of an MRI system according to another embodiment of the present invention.
Figure 8:
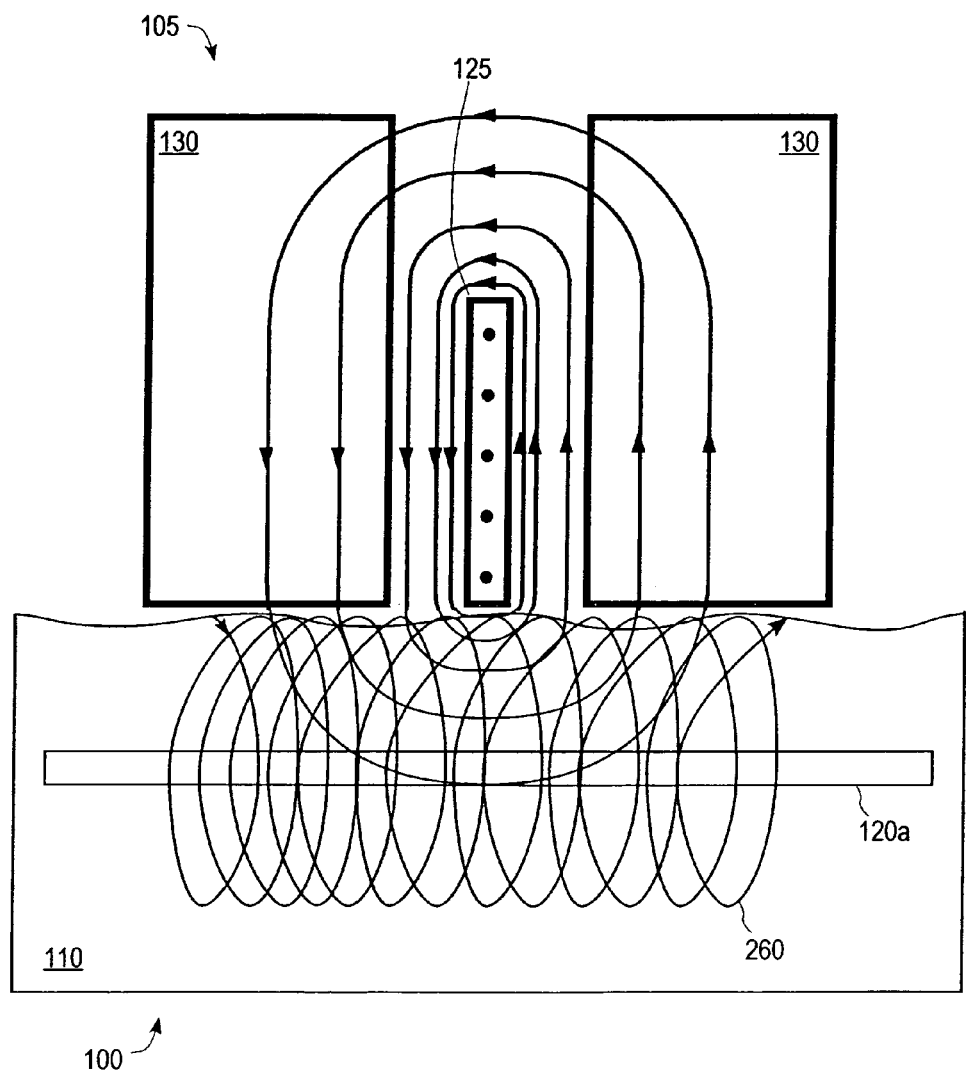
FIG. 8 is a simplified schematic showing an RF magnetic-field generator in a liquid according to one embodiment of the present invention.

FIG. 7 is a simplified schematic of a specific embodiment of MRI system 100 and shows a side view of a specific embodiment of RF magnetic-field generator. According to the specific embodiment shown in FIG. 7, RF magnetic-field generator includes a conductive strip 120a that is positioned adjacent to, or on, a lower surface 250 of sample 110. As shown in FIG. 7, lower surface 250 is substantially opposite an upper surface 255 of sample such that the upper surface is adjacent to magnetic-resonance sensor 105. The electronic-control module may be configured to drive an alternating current through the conductive strip to generate an RF magnetic field 260. The frequency of the alternating current and the frequency of the RF magnetic field may substantially match the resonant frequency of the spins of the sample to cause the spins to precess to generate a magnetic resonance signal. At the region of the sample for which a magnetic-resonance image is to be generated, the portion of the RF magnetic field in this region is substantially perpendicular to magnetic field 135. The RF magnetic field is also substantially perpendicular to the magnetic sensing axis (e.g., y-axis) of the magneto-resistive element. According to one embodiment, if sample 110 is a fluid sample (e.g., a liquid sample), conductive strip 120a might be at least partially immersed in the fluid sample (see FIG. 8).

Figure 9:
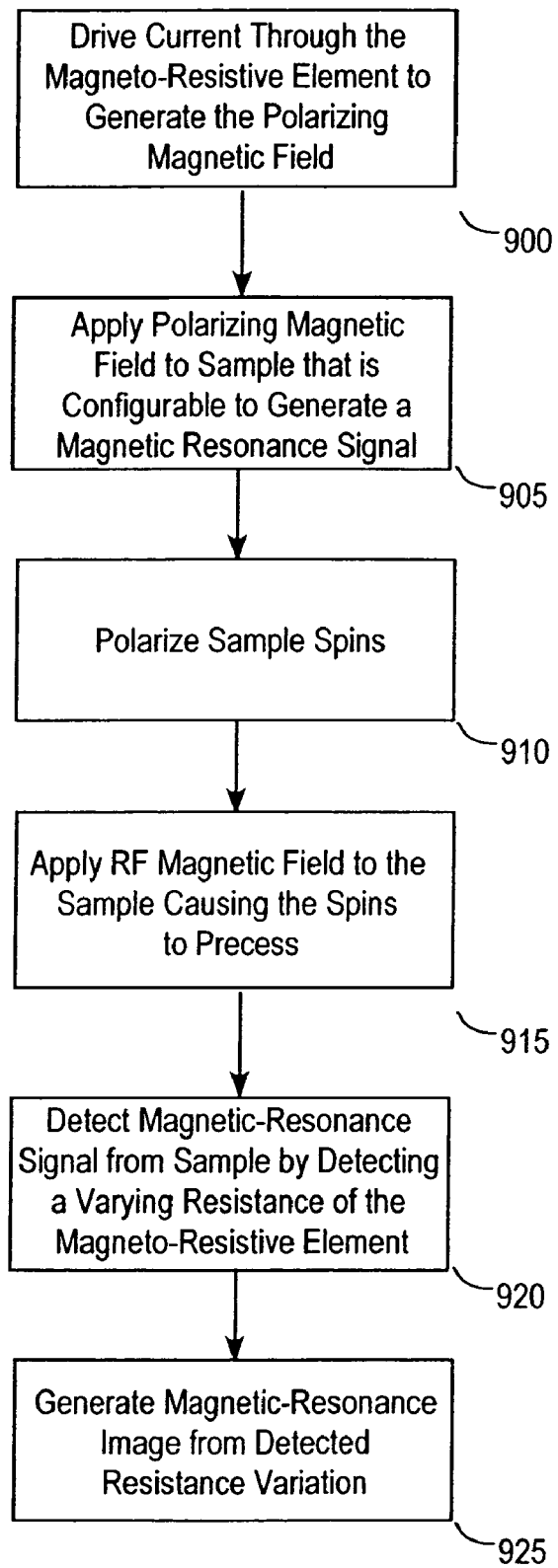
FIG. 9 is a high-level flow chart having steps for generating a magnetic-resonance image according to an embodiment of the present invention.

FIG. 9 is a high-level flow chart having steps for generating a magnetic-resonance image according to an embodiment of the present invention. The high-level flow chart is merely exemplary, and those of skill in the art will recognize various steps that might be added, deleted, and/or modified and are considered to be within the purview of the present invention. Therefore, the exemplary embodiment should not be viewed as limiting the invention as defined by the claims. At 900, a current is driven though a magneto-resistive element to generate a magnetic field. The current may be driven through the magneto-resistive sensor by one or more electronic modules that may be computer controlled. At 905, the magnetic field is applied to a sample that may be configured to generate a magnetic-resonance signal. At 910, a plurality of spins of the sample is polarized by the magnetic field. The spins include nuclear spins and electronic spins. At 915, a radio-frequency (RF) magnetic field is applied to the sample causing at least one of the nuclear spins and/or the electronic spins to precess. The frequency of the RF magnetic field is set to substantially match a resonant frequency of at least one of the nuclear spins and electronic spins. According to some embodiments, the frequency of the RF magnetic field is set to one or more frequencies in the range of approximately 10 kilohertz to approximately 10 megahertz, inclusive, for nuclear spins, and set to one or more frequencies in the range of approximately 10 megahertz to approximately 10 gigahertz, inclusive, for electron spins.

At 920, the magnetic-resonance signal of the precessing spins is detected by the magneto-resistive sensor causing the resistance of the magneto-resistive sensor to change. The resistance change may be detected by the electronic module as a voltage change associated with the current driven through the magneto-resistive sensor by the electronic module. At 925, a magnetic-resonance image is generated from the resistance change as the resistance change inherently includes information of the magnetic-resonance signal. While the foregoing steps describe a method for forming a magnetic-resonance image, the method might also be used to generate magnetic-resonance spectroscopy information by sweeping the frequency of the RF magnetic field applied to the sample.

It is to be understood that the examples and embodiments described above are for illustrative purposes only and that various modifications or changes in light thereof will be suggested to persons skilled in the art and are to be included within the spirit and purview of this application and scope of the appended claims. For example, while the magnetic-resonance systems described herein have been described as being configured to generate magnetic-resonance images, the described magnetic-resonance system may be configured for magnetic-resonance spectroscopy, for example, by varying the magnetic field strength generated by the magneto-resistive sensor by varying the current driven through the sensor by the control electronics. Thereby, embodiments of the present invention may be configurable for chemical analysis or other spectrographic analysis of samples. Therefore, the above description should not be taken as limiting the scope of the invention as defined by the claims.

What is claimed is:

1. A magnetic-resonance imaging system comprising:
   a magnetic-resonance sensor including at least one magneto-resistive element; and
   a sample disposed adjacent to the magnetic-resonance sensor and configurable to generate a magnetic-resonance signal,
   wherein the magneto-resistive element is configured to:
      generate a magnetic field in response to a current driven through the magneto-resistive element, the magnetic field being configured to polarize spins of the sample, and
      detect a magnetic-resonance signal from precession of the spins.

2. The system of claim 1, wherein the magnetic-resonance sensor further includes at least first and second magnetic shields disposed on opposite sides of the magneto-resistive element, and the first and second magnetic shields are configured to magnify the magnetic field in the sample.

3. The system of claim 1, wherein the magneto-resistive element is configured to detect a magnetic-resonance signal from precession of the spins for magnetic-resonance image formation.

4. The system of claim 1, wherein the magneto-resistive element is configured to detect a magnetic-resonance signal from precession of the spins for collection of magnetic-resonance spectroscopy information.

5. The system of claim 1, further comprising an electronic module configured to detect resistance changes of a resistance of the magneto-resonance element, wherein the resistance is configured in response to the detected magnetic-resonance signal.

6. The system of claim 5, wherein the electronic module is configured to detect voltage changes of a voltage across the magneto-resistive element, the voltage being configured to change in response to the resistance changes.

7. The system of claim 6, further comprising a computer system configured to collect information of the varying voltage and generate a magnetic-resonance image based on the information.

8. The system of claim 5, wherein the electronic module is configured to drive the current through the magneto-resistive element.

9. The system of claim 8, wherein the electronic module is configured to vary the current driven through the magneto-resistive element, and wherein the magnetic-resonance signal includes spectroscopy information.

10. The system of claim 1, further comprising a translation system configured to translate the magnetic-resonance sensor across at least a portion of a surface of the sample, wherein a generated magnetic-resonance image includes image information associated with the portion of the surface.

11. The system of claim 1, further comprising a translation system configured to translate the magnetic-resonance sensor and the sample relative to one another.

12. The system of claim 11, wherein the translation system is coupled to one or both to the magnetic-resonance sensor and the sample.

13. The system of claim 1, further comprising a plurality of magnetic-resonance sensors that includes the first mentioned magnetic-resonance sensor, wherein each of the magnetic-resonance sensors includes a magneto-resistive element.

14. The system of claim 13, wherein the plurality of magnetic-resonance sensors are linearly arranged.

15. The system of claim 13, wherein the plurality of magnetic-resonance sensors are arranged in an array.

16. The system of claim 1, further comprising a radio frequency (RF) magnetic-field generator configured to generate a RF magnetic field having a frequency that substantially matches the resonant frequency of the spins and is configured to couple to the spins causing the spins to precess.

17. The system of claim 16, wherein the RF magnetic field is pulsed or continuous.

18. The system of claim 16, wherein a portion of the RF magnetic field in the sample is substantially perpendicular to the magnetic field in the sample and is substantially perpendicular to a magnetic sensing direction of the magneto-resistive element.

19. The system of claim 16, wherein the spins precess at varying frequencies as a function of distance from the magneto-resistive element, and wherein the magnetic-resonance signals of the spins are detected by the magneto-resistive element for generations of a plurality of magnetic-resistance images of a corresponding plurality of cross-sections of the sample.

20. The system of claim 16, wherein the spins precess at varying frequencies as a function of distance from the magneto-resistive element, and wherein the magnetic-resonance signals from the spins are detected by the magneto-resistive element for generations of a plurality magnetic-resistance spectroscopy information a corresponding plurality of cross-sections of the sample.

21. The system of claim 16, wherein the RF magnetic-field generator includes a conductive strip disposed adjacent to a surface of the sample and configured to generate the RF magnetic field in response to an alternating electric current driven though the conductive strip.

22. The system of claim 21, wherein the surface is positioned substantially opposite from another surface of the sample, and the other surface is adjacent the magnetic-resonance sensor.

23. The system of claim 1, wherein the spins includes nuclear spins and/or electronic spins.

24. The system of claim 1, further comprising a magnetic field generator configured to generate a magnetic field that is substantially parallel to a portion of the magnetic field, which is generated by the magneto-resistive element, in a region of the sample from which the magnetic-resonance signal is detected.

25. The system of claim 24, wherein the magnetic filed generator is one or more of a coil, a superconducting coil, and a permanent magnet.

26. A magnetic-resonance imaging system comprising:
a magnetic element configured to generate a first magnetic field and sense second magnetic field, wherein the magnetic element is configured to change resistance based on sensing the second magnetic field;
a radio frequency (RF) magnetic-field generator configured to generate an RF magnetic field; and
a sample configured to receive the first magnetic field and the RF magnetic field, wherein the first magnetic field is configured to polarize spins in the sample and the RF field is configured to cause the spins to precess, and wherein the second magnetic field includes a magnetic-resonance signal of the precessing spins.

27. The system of claim 26, wherein the spins include nuclear spins and/or electronic spins.

28. The system of claim 27, wherein the RF magnetic field has a frequency that substantially matches the resonant frequency of the nuclear spins and/or the electronic spins.

29. The system of claim 28, wherein the second magnetic field is a time varying magnetic field.

30. A magnetic-resonance method comprising:
driving a current though a magneto-resistive element to generate a magnetic field;
applying the magnetic field to a sample;
polarizing a plurality of spins of the sample in response to the applying step;
applying a radio-frequency (RF) magnetic field to the sample to precess the spins about an axis, wherein a frequency of the RF magnetic field substantially matches a resonant frequency of the spins;
receiving in the magneto-resistive element a varying magnetic field generated by the precessing spins;
detecting a resistance change of the magneto-resistive element in response to the receiving step; and
generating a magnetic-resonance image based on the changing resistance of the magneto-resistive element.

31. The method of claim 30, wherein the step of detecting the resistance change includes measuring a changing voltage across the magneto-resistive element.

32. The method of claim 31, wherein the voltage is associated with the current driven through the magneto-resistive element.

33. The method of claim 30, further comprising condensing the magnetic field with a set of ferromagnetic shields.

34. The method of claim 30, further comprising positioning a RF magnetic-field generator, which is configured to generate the RF magnetic field, adjacent to a first side of the sample, wherein the first side is substantially opposite to a second side of the sample that is adjacent to the magneto-resistive element.

35. The method of claim 34, wherein the RF magnetic field is a continuous wave magnetic field.

36. The method of claim 34, wherein the RF magnetic field is has a periodically changing magnitude.

37. The method of claim 30, wherein the spins are nuclear spins and electronic spins.

38. The method of claim 30, further comprising scanning the magneto-resistive element across at least a portion of a surface of the sample, wherein the magnetic-resonance image includes image information associated with the portion of the surface.

39. The method of claim 30, wherein the step of generating a magnetic-resonance image includes generating a plurality magnetic-resistance images of a corresponding plurality of cross-sections of the sample in response to detecting magnetic-resonance signals from the spins, wherein the spins precess at varying frequencies as a function of distance from the magneto-resistive element.

40. The method of claim 30, further comprising generating a plurality magnetic-resonance spectroscopy information for a corresponding plurality of cross-sections of the sample in response to detecting magnetic-resonance signals from the spins, wherein the spins precess at varying frequencies as a function of distance from the magneto-resistive element.

41. A computer program product configured to operate on a computer system comprising:
code for driving a current though a magneto-resistive element to generate a magnetic field in a sample to polarize a plurality of spins of the sample;
code for applying a radio-frequency (RF) magnetic field to the sample to process the spins about an axis, wherein a frequency of the RF magnetic field substantially matches a resonant frequency of the spins;
code for receiving from the magneto-resistive element an electronic signal of a varying magnetic field generated by the precessing spins, and
code for generating a magnetic-resonance image and/or a magnetic-resonance spectrum based on the electronic signal from the magneto-resistive element.

42. The computer program product of claim 41, wherein the electronic signal includes information for resistance change of the magneto-resistive element.

* * * * *